US011340278B2

(12) United States Patent
Rowell

(10) Patent No.: US 11,340,278 B2
(45) Date of Patent: May 24, 2022

(54) MEASUREMENT SYSTEM FOR TESTING A DEVICE UNDER TEST OVER-THE-AIR

(71) Applicant: Rohde & Schwarz GmbH & Co. KG, Munich (DE)

(72) Inventor: Corbett Rowell, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 25 days.

(21) Appl. No.: 16/836,707

(22) Filed: Mar. 31, 2020

(65) Prior Publication Data

US 2021/0302484 A1 Sep. 30, 2021

(51) Int. Cl.
*G01R 29/08* (2006.01)
(52) U.S. Cl.
CPC ..... *G01R 29/0878* (2013.01); *G01R 29/0892* (2013.01)
(58) Field of Classification Search
CPC ............ G01R 29/0878; G01R 29/0892; G01R 13/345; G01R 23/16; G01R 27/32; G01R 13/0272; G01R 19/04
See application file for complete search history.

(56) References Cited

U.S. PATENT DOCUMENTS

| | | | | |
|---|---|---|---|---|
| 2011/0084887 A1* | 4/2011 | Mow | ...................... | G01R 29/10 343/703 |
| 2013/0207680 A1* | 8/2013 | Garreau | ............... | G01R 1/0408 324/750.23 |
| 2019/0036621 A1* | 1/2019 | Vanwiggeren | ....... | H04B 17/354 |
| 2019/0302184 A1* | 10/2019 | Rowell | ................ | H04B 17/101 |
| 2020/0244377 A1* | 7/2020 | Maruo | ................... | H04B 17/15 |

FOREIGN PATENT DOCUMENTS

EP 3462190 A1 4/2019

* cited by examiner

*Primary Examiner* — Jermele M Hollington
*Assistant Examiner* — Suresh K Rajaputra
(74) *Attorney, Agent, or Firm* — Christensen O'Connor Johnson Kindness PLLC

(57) ABSTRACT

The present disclosure relates to a measurement system for testing a device under test over-the-air, the measurement system comprising a signal generation and/or analysis equipment, several antennas, several reflectors and a test location for the device under test. The antennas are connected with the signal generation and/or analysis equipment in a signal-transmitting manner. Each of the antennas is configured to transmit and/or receive an electromagnetic signal so that a beam path is provided between the respective antenna and the test location. The electromagnetic signal is reflected by the respective reflector so that the electromagnetic signal corresponds to a planar wave. Each antenna aims at a focal point of the corresponding reflector. Each antenna and the corresponding reflector together are configured to provide a corresponding quiet zone at the test location. At least two of the several antennas are located within a main plane, whereas at least one of the several antennas is located in an auxiliary plane that is offset with respect to the main plane.

19 Claims, 6 Drawing Sheets

MEASUREMENT SYSTEM FOR TESTING A DEVICE UNDER TEST OVER-THE-AIR

FIELD OF THE DISCLOSURE

The present disclosure relates to a measurement system for testing a device under test over-the-air.

BACKGROUND

In the state of the art, measurement systems are known for testing devices under test with regard to their over-the-air characteristics (OTA characteristics). The device under test typically relates to a communication device that uses modern telecommunication standards for communicating with another communication device, for instance a mobile device or a base station. For testing the device under test, at least one measurement antenna is directed towards the device under test to be tested by the measurement system wherein this measurement antenna is located in the far-field of the device under test. Hence, it is ensured that the far-field characteristics of the device under test can be tested in an appropriate manner.

Furthermore, it is known to use multiple measurement antennas that are located in the far-field in order to test the far-field characteristics of the device under test in a more accurate manner. For instance, handover scenarios can be tested by means of the multiple measurement antennas.

Typically, different measurement setups, for instance after rearranging reflectors provided by the measurement system, are used for testing the device under test according to different test scenarios, particularly measuring multiple angles of arrival of electromagnetic signals. These different test scenarios may relate to radio resource management (RRM), multiple-input multiple-output (MIMO) and/or radio frequency (RF) measurements requiring different set-ups. Accordingly, it is necessary to adapt the respective measurement system concerning its respective setup or rather use different measurement systems for performing the respective measurements. Obviously, the adaption of the measurement setup, by either adapting the measurement system or using a completely different measurement system, is time-consuming.

Furthermore, it is necessary to ensure a proper isolation between adjacent antennas in order to reduce a coupling between adjacent antennas that impairs the performance when testing the device under test. Typically, the isolation is ensured by means of baffles which however cannot be used everywhere.

SUMMARY

Accordingly, there is a need for a more efficient possibility to perform different tests on a device under test while ensuring good performance.

The present disclosure provides a measurement setup for testing a device under test over-the-air (OTA), which comprises a signal generation and/or analysis equipment, several antennas, several reflectors and a test location for the device under test. The antennas are connected with the signal generation and/or analysis equipment in a signal-transmitting manner. Each of the antennas is configured to transmit and/or receive an electromagnetic signal so that a beam path is provided between the respective antenna and the test location. The electromagnetic signal is reflected by the respective reflector so that the electromagnetic signal corresponds to a plane wave. Each antenna aims at a focal point of the corresponding reflector. Each antenna and the corresponding reflector together are configured to provide a corresponding quiet zone at the test location. Further, at least two of the several antennas are located within a main plane, whereas at least one of the several antennas is located in an auxiliary plane that is offset with respect to the main plane.

Moreover, the present disclosure provides a measurement setup for testing a device under test over-the-air (OTA), which comprises a signal generation and/or analysis equipment, several antennas, several reflectors and a test location for the device under test. The antennas are connected with the signal generation and/or analysis equipment in a signal-transmitting manner. Each of the antennas is configured to transmit and/or receive an electromagnetic signal so that a beam path is provided between the respective antenna and the test location. The electromagnetic signal is reflected by the respective reflector so that the electromagnetic signal corresponds to a plane wave. Each antenna aims at a focal point of the corresponding reflector. Each antenna and the corresponding reflector together are configured to provide a corresponding cylindrical quiet zone at the test location. Further, in spherical coordinates, one of the several antennas is rotated about the center of the cylindrical quiet zone by a polar angle that is different to the polar angle of at least one other antenna.

In addition, the present disclosure provides a measurement setup for testing a device under test over-the-air (OTA), which comprises a signal generation and/or analysis equipment, several antennas, several reflectors and a test location for the device under test. The antennas are connected with the signal generation and/or analysis equipment in a signal-transmitting manner. Each of the antennas is configured to transmit and/or receive an electromagnetic signal so that a beam path is provided between the respective antenna and the test location. The electromagnetic signal is reflected by the respective reflector so that the electromagnetic signal corresponds to a plane wave. Each antenna aims at a focal point of the corresponding reflector. Each antenna and the corresponding reflector together are configured to provide a corresponding quiet zone at the test location. Further, at least two of the several reflectors are orientated with respect to a symmetry direction in a similar manner, whereas at least one of the several reflectors is tilted with respect to the symmetry direction compared to the other reflectors.

The present disclosure is based on the finding that a coupling between adjacent antennas is reduced since the antennas are located in different planes, namely the main plane and the auxiliary plane that are offset with respect to each other. Since the coupling or rather interference among adjacent antennas is reduced, the performance of the entire measurement system is improved. In other words, the separation between the antennas is increased when locating them in different planes.

The respective antennas and the corresponding reflectors together each ensure that indirect far-field (IFF) conditions are provided at the test location. The indirect far-field (IFF) conditions obtained ensure that a respective quiet zone is provided encompassing the test location (and a device under test located at the test location during testing).

The several reflectors ensure that multiple angles of arrival can be measured by means of the measurement system. Furthermore, hand-over scenarios or other test scenarios can be tested by means of the measurement system.

Generally, a quiet zone may relate to a volume in which the device under test is exposed to electromagnetic waves with nearly uniform amplitude and phase. Typically, minor deviations from the above-mentioned ideal situation are allowed in which the amplitude and phase are uniform within the volume.

For instance, the respective electromagnetic signal originating from the antenna is reflected by the corresponding reflector such that the electromagnetic signal relates to a planar wave at the test location.

In general, the measurement system corresponds to a compact antenna test range (CATR), as the measurement system ensures plane wave exposure of the device under test at its test location, namely within the respective quiet zone. In a real environment, a respective quiet zone is obtained by a long far-field range. However, the compact antenna test range ensures that the same characteristics, namely the quiet zone, is obtained at a short distance. As already mentioned, indirect far-field (IFF) conditions are provided due to the reflector(s) provided that reflect the electromagnetic signals from/towards the test location.

The respective reflectors may be shaped. For instance, the reflectors are shaped in a parabolic manner. Hence, parabolically shaped reflectors are provided.

In general, the antennas of the measurement system correspond to feed antennas. Hence, the electromagnetic signals used for testing the device under test originate from the respective antennas.

As mentioned above, the quiet zone at the test location may be a cylindrical one. Furthermore, in spherical coordinates, one of the several antennas is rotated about the center of the cylindrical quiet zone by a polar angle that is different to the polar angle of at least one other antenna, for example different to the polar angle of at least two other antennas. Generally, the rotation about the center of the cylindrical quiet zone by different polar angles effects that the respective antenna is located in a different plane, namely the auxiliary plane, than the other antennas that are located in the main plane.

Furthermore, at least two of the several reflectors are orientated with respect to a symmetry direction in a similar manner, whereas at least one of the several reflectors is tilted with respect to the symmetry direction compared to the other reflectors. The symmetry direction is called symmetry direction since merely all of the reflectors are orientated in the same manner with regard to the symmetry direction. In some embodiments, the symmetry direction may be parallel to the axis of the cylindrically shaped quiet zone. Thus, one of the several reflectors is tilted with regard to this axis or rather symmetry direction differently compared to the other reflectors. In some embodiments, the respective reflector is the one that is associated with the antenna located in the auxiliary plane since the antenna aims at the focal point of the corresponding reflector.

In other words, tilting the respective reflector with respect to the symmetry direction causes to reposition the corresponding antenna or vice versa provided that the antenna shall still aim at the focal point of the corresponding reflector and that the antenna and the corresponding reflector shall contribute to the quiet zone at the test location.

In some embodiments, all of the several antennas, except for the respective antenna, are located in the main plane, whereas the respective antenna is located in the auxiliary plane.

According to an aspect, the main plane and the auxiliary plane are parallel to each other. Hence, the respective planes do not intersect each other. In other words, the planes are not skew with respect to each other.

Another aspect provides that the quiet zone is a cylindrical quiet zone. The electromagnetic waves forwarded to the test location form the different reflectors together form the cylindrical quiet zone. For instance, the reflectors are arranged around the test location such that the electromagnetic waves forwarded to the test location overlap with each other in a volume that substantially corresponds to a cylindrical one.

According to another aspect, in spherical coordinates, the antenna located in the auxiliary plane is rotated about the center of the cylindrical quiet zone by a polar angle that is different to the one of the antennas located in the main plane. As mentioned above, the rotation about the center by the polar angle results in a position of the respective antenna associated with a different plane compared to the one assigned to the other antennas.

Another aspect provides that at least one of the reflectors is bigger than the at least one other reflector. Thus, the respective physical size of the reflectors is different. This may yield differently sized quiet zones associated with each reflector. For instance, the quiet zone of the bigger sized reflector is between 20 cm and 40 cm, for instance (about) 30 cm, whereas the at least one other reflector has a quiet zone having a size between 10 cm and 30 cm, for example (about) 20 cm.

Generally, the respective quiet zones each overlap at the test location in order to form a common quiet zone. To the common quiet zone all quiet zones associated with the antennas and/or reflectors contribute.

Another aspect provides that at least one of the reflectors has a different focal length compared to the at least one other reflector. The focal length generally allows to provide a bigger quiet zone while having the same distance between the test location and the respective reflector. Due to the different focal length of the at least one reflector, the corresponding antenna has a different distance to the respective reflector with the different focal length compared to the other pairs of reflectors and antennas. However, the different focal length can be used to ensure that the respective quiet zone is larger compared to the other ones.

In some embodiments, at least one of the antennas is moved with respect to its corresponding reflector in order to compensate the different focal length of the reflector.

In spherical coordinates, the respective movement of the antenna corresponds to an adjustment of the radial distance.

The physical size and/or the focal length relate(s) to a characteristic of the respective reflector.

In spherical coordinates, the different reflectors and/or the corresponding antennas are placed at different angular offsets with respect to the test location concerning the azimuthal angle.

For instance, the several reflectors are located along a circularly or elliptically shaped arc in the center of which the test location is located. The different reflectors may be distanced with respect to the test location by the same distance (radius or radial distance) provided that the different reflectors are located on the circularly shaped arc.

The antennas located in the main plane may also be located on a circularly shaped arc. For instance, the distance between these antennas and the corresponding reflector is the same.

One of the reflectors may be larger than the other ones resulting in a larger quiet zone.

The larger reflector can be used for radio frequency (RF) measurements, for instance in-band (IB) and out-of-band (OOB) measurements, whereas the smaller reflector(s) is/are used for radio resource management (RRM) and/or multiple-input multiple-output (MIMO) measurements.

Generally, the respective measurements may be performed simultaneously or subsequently.

Besides the circularly shaped arc, the reflectors may also be located on an elliptically shaped arc.

Hence, the antennas located in the main plane may also be located on an elliptically shaped arc.

In some embodiments, the circularly or elliptically shaped arc maximally covers an angular area of 180°. This angular area is sufficient for testing the device under test with respect to handover scenarios. The circularly shaped arc covering an angular area of 180° corresponds to a semicircle.

As already mentioned above, the antennas and/or reflectors are placed at different angular offsets with respect to the test location concerning the azimuth angle in spherical coordinates. Hence, an angular area lower than 180° concerning the azimuth angle may be covered.

According to another aspect, at least the reflectors are each assigned to a corresponding adjustment unit configured to adjust the orientation of the respective reflector. Therefore, the reflectors may be adjusted with respect to their orientation, for example with respect to the test location or rather the corresponding antenna. In other words, the beam path provided between the antenna and the test location via the respective reflector can be adapted or rather adjusted by means of the adjustment unit while adjusting the orientation.

The respective reflector the orientation of which was adapted can still be located on the respective arc. However, the reflector is tilted with respect to the symmetry direction by means of the adjustment unit. Accordingly, the respective reflector is turned in its reflector plane.

In other words, the tilted reflector points in a different direction than the other reflectors.

The adjustment unit may comprise a joint, wherein the reflector is mechanically coupled with the joint. Thus, the orientation of the reflector can be adjusted easily by means of the joint.

Furthermore, the antenna may also be coupled to the adjustment member by means of a displaceable joint. Hence, the orientation of the antenna can be adjusted easily as well.

In some embodiments, the respective antenna and the corresponding reflector are mechanically coupled with each other by the adjustment unit. The adjustment unit may comprise an adjustment member on which the antenna and the corresponding reflector are located. In some embodiments, the antenna and the corresponding reflector are mechanically coupled with the adjustment member in a displaceable manner. Therefore, the respective distance between the antenna and the corresponding reflector, namely the radial distance in spherical coordinates, can be adjusted by the adjustment unit by simply displacing the antenna and/or the reflector with respect to each other, for example in a linear manner.

Moreover, the several reflectors may be located at least partially along a sphere enclosing the test location at its center point. In a simple test setup, the respective reflectors are located on a table or rather floor resulting in a horizontal arrangement.

However, the respective reflectors may also be orientated in a different manner, for instance in a vertical manner (90° with respect to a horizontal plane) or any other angular inclination with respect to the horizontal plane, for instance by 60°. In some embodiments, an entire sphere can be covered by the different suitable positions of the reflectors.

Alternatively, the several reflectors may be located at least partially along an ellipsoid enclosing the test location at its center point.

The reflectors may be connected with each other by a support, for instance a rail or rather a bar. In some embodiments, the support is shaped like a circular or elliptical arc. The respective support may be pivoted or rather set up from the horizontal plane, resulting in reflectors located at a certain angular inclination with respect to the horizontal plane.

In case of non-equally distributed reflectors, at least one balance weight is provided on the support, for example in case of an angled or rather vertical orientation of the respective reflectors due to their respective weight.

Accordingly, at least one balance weight is provided that is assigned to the reflectors in case of a non-equal distribution of the reflectors in an angled or rather vertical orientation of the respective reflectors along the sphere or an ellipsoid.

According to another aspect, an elongation of the beam path portion located between the reflector and the test location is reflector-free. This means that no other reflector is provided within the elongation of the respective beam path portion originating from the reflector towards the test location. Accordingly, reflecting portions of the electromagnetic signal is prevented effectively, which would result in a standing wave, namely a resonance.

Another aspect provides that at least one absorbing baffle is provided. The absorbing baffle generally ensures that the electromagnetic waves originating from a certain antenna only interact with the corresponding reflector.

The at least one absorbing baffle may be located between neighbored reflectors. Hence, the absorbing baffle is used to prevent adjacent antennas from coupling with each other which may result in an interference which is not intended.

Alternatively or additionally, the at least one absorbing baffle is located between at least one reflector and the test location. Hence, reflections from the floor or from any other object in the beam path portion between the reflector and the test location can be avoided effectively.

Alternatively or additionally, the at least one absorbing baffle provides a partly opened housing for at least one antenna. Therefore, the antenna is partially shielded such that any side lobes face towards the respective housing, ensuring that the electromagnetic waves associated therewith do not impinge on another reflector. Hence, the at least one absorbing baffle may establish an aperture around the antenna so that the respective antenna aims at the corresponding reflector, for example its center.

Alternatively or additionally, the at least one absorbing baffle is located at a first end of a line at which opposite end the reflector is located. On the respective line, the test location is located, for example in its middle. Accordingly, electromagnetic signals running across the test location impinge on the respective absorbing baffle such that they are not reflected backwards. In other words, the elongation of the beam path portion located between the reflector and the test location may end at the at least one absorbing baffle, ensuring that no reflections take place that might impair the measurements, for instance providing a standing wave (resonance).

Generally, the at least one absorber baffle reduces coupling and/or scattering effects between the respective components of the measurement setup, for example reflectors and their corresponding antennas.

Furthermore, the at least one absorbing baffle provides a shielding such that no external interfering signals may disturb the respective measurement.

In a similar manner, other measurement equipment located in the same room is not disturbed by the electromagnetic signals provided by the measurement system during the respective measurements.

Another aspect provides that a device under test is provided that is located at the test location. The measurement system can be used to test the device under test appropriately. For this purpose, electromagnetic signals or rather electromagnetic waves may be generated and transmitted towards the device under test.

However, the respective measurement system may also be used differently such that the device under test located at the test location emits electromagnetic signals or rather electromagnetic waves that impinge on the reflectors that reflect the signals/waves originating from the device under test towards the corresponding antennas. The antennas receive the signals/waves and forward them to the signal generation and/or analysis equipment for analysis.

According to another aspect, the measurement system comprises a positioner on which the test location is provided. The respective positioner ensures that the behavior of the device under test can be measured separately for each angle by positioning the device under test through the field obtained under plane wave conditions within the quiet zone or rather at the test location. The positioner may move the device under test such that a moving device under test is simulated. Therefore, it is possible to test performance characteristics of the device under test while moving. For instance, it can be verified how fast the device under test can switch between different base stations (handover scenario).

The positioner in some embodiments is a rotary positioner and/or a three-dimensional positioner. The rotary positioner performs a rotational movement of the device under test with a certain plane. The three-dimensional positioner may additionally move the device under test in the space such that a three-dimensional movement of the device under test can be investigated during the respective measurements. For instance, the device under test can be moved along a sphere during the respective testing. In some embodiments, the rotary positioner and/or a three-dimensional positioner includes one or more rotary and/or linear stages to affect movement of the device under test.

Furthermore, center fed reflectors may be used. Accordingly, the respective antenna, the center of the corresponding reflector as well as the quiet zone are on a straight line.

Moreover, a method of performing an over-the-air test of a device under test is provided. In an embodiment, the method includes the following steps:
providing a measurement system as mentioned above,
positioning the device under test at the test location, and
using at least one of the reflectors and the corresponding antenna for radio frequency measurements.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
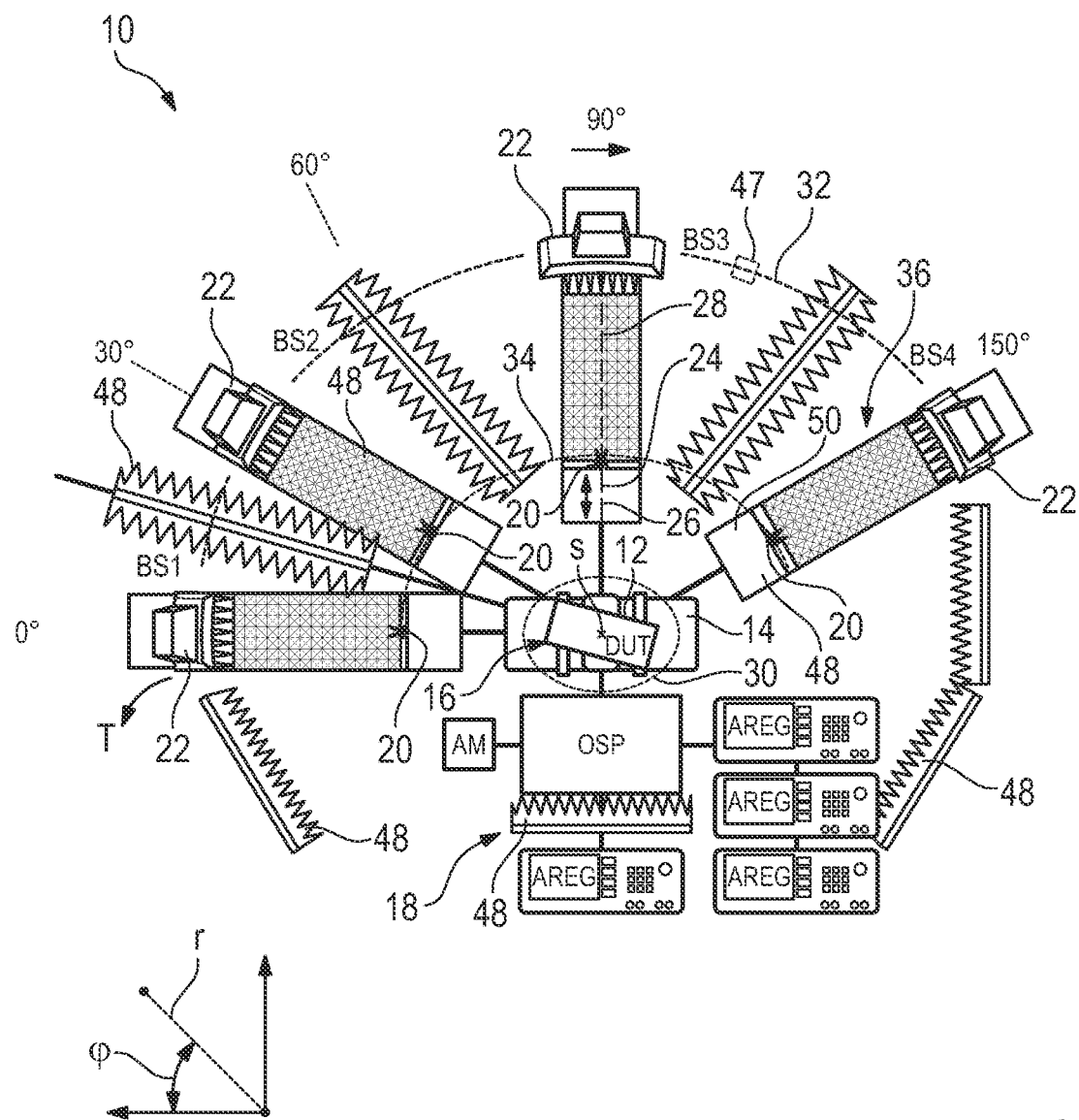
FIG. 1 shows a top view on a measurement system according to an embodiment of the present disclosure.

In FIG. 1, a measurement system 10 is shown that is used for testing a device under test 12 over-the-air, which is also called DUT. In an embodiment, the measurement system 10 comprises a positioner 14 that defines a test location 16 for the device under test 12. The device under test 12 is mounted on the positioner 14, for example at the test location 16.

In the shown embodiment, the positioner 14 is established by a rotary positioner configured to rotate the device under test 12 in a plane around an axis of rotation. However, the positioner 14 may also be established as a three-dimensional positioner ensuring a three-dimensional movement of the device under test 12, for instance along a sphere. In some embodiments, the rotary positioner and/or a three-dimensional positioner includes one or more rotary and/or linear stages to affect movement of the device under test 12.

The measurement system 10 also comprises a signal generation and/or analysis equipment 18. The signal generation and/or analysis equipment 18 is connected with the positioner 14 and includes one or more circuits configured to control positioning of the device under test 12 via the positioner 14 during testing. In some embodiments, the signal generation and/or analysis equipment 18 issues respective control signals in order to control the position of the device under test 12.

In addition, the signal generation and/or analysis equipment 18 is connected with several antennas 20, 20' in a signal-transmitting manner. Hence, measurement signals received by the antennas 20, 20' are forwarded to the signal generation and/or analysis equipment 18. In a similar manner, signals to be emitted are forwarded to the antennas 20, 20' by the signal generation and/or analysis equipment 18.

In the shown embodiment, the signal generation and/or analysis equipment 18 comprises a signal generation means, for instance so-called Automotive Radar Echo Generators ("AREG"), and a controlling platform, for instance an Open Switch and Control Platform ("OSP"). The OSP may be connected with an analyzing module ("AM") or circuit.

In some embodiments, each antenna 20, 20' is assigned to its own signal generation means, namely its own AREG. Thus, each antenna 20, 20' may receive a respectively generated electromagnetic signal to be emitted. Accordingly, the signals to be emitted are generated by the signal generation means of the signal generation and/or analysis equipment 18 and routed to the antennas 20, 20' for being emitted towards the device under test 12.

The measurement system 10 further comprises several shaped reflectors 22, 22', for example parabolic reflectors. Each of the reflectors 22, 22' is assigned to one corresponding antenna 20, 20' such that the respective antenna 20, 20' and the corresponding reflector 22, 22' together establish a pair. In some embodiments, each antenna 20, 20' aims at a focal point of the corresponding reflector 22, 22'.

Generally, a beam path 24 is provided between the respective antenna 20, 20' and the test location 16 along which the electromagnetic signals propagate. One of the several beam paths 24 provided is schematically shown in FIG. 1 by respective dashed lines. The beam path 24 comprises a first portion 26 located between the test location 16 and the reflector 22, 22' as well as a second portion 28 established between the reflector 22, 22' and the corresponding antenna 20, 20'.

In some embodiments, the electromagnetic signal is reflected by the respective reflector 22, 22' irrespective of the fact from where the electromagnetic signal originates, namely the device under test 12 or rather the respective antenna 20, 20'. In any case, it is ensured by the beam path 24 that the electromagnetic signal corresponds to a planar wave at the test location 16 or rather the respective antenna 20, 20'.

Generally, the antennas 20, 20' may relate to feed antennas via which the electromagnetic signals are emitted.

Accordingly, the electromagnetic signals emitted by the antennas 20, 20' impinge on the reflectors 22, 22' after having travelled along the second portion 28 of the beam path 24. The respective reflectors 22, 22' reflect the incoming electromagnetic signals originating from the antennas 20, 20' towards the test location 16 as well as the device under test 12 located at that test location 16. Hence, the electromagnetic signals reflected travel along the first portion 26 of the beam path 24.

In general, the measurement system 10 is configured to test the far-field characteristics of the device under test 12 even though the distance between the respective antennas 20, 20' and the test location 16 is low.

In order to ensure far-field characteristics at the test location 16, the respective electromagnetic signals are reflected by the reflectors 22, 22' as mentioned above. Hence, so-called indirect far-field (IFF) conditions are provided.

Accordingly, each antenna 20, 20' and the corresponding reflector 22, 22' together, namely the respective pairs, provide a dedicated quiet zone 30 at the test location 16 ensuring that the far-field characteristics of the device under test 12 can be measured accurately.

In FIG. 1, one quiet zone 30 is schematically illustrated by dashed lines. As shown in FIG. 1, the respective quiet zone 30 encompasses the device under test 12 and the test location 16, respectively. In an embodiment, the quiet zone 30 has a cylindrical shape.

In general, the measurement system 10 corresponds to a so-called compact antenna test range (CATR) since the measurement system 10 ensures plane wave exposure of the device under test 12 at the test location 16 or rather within the respective quiet zone(s) 30.

In the embodiment shown in FIG. 1, the several reflectors 22, 22' are located along a circularly shaped arc 32 in the center of which the test location 16 or rather the device under test 12 is located.

Further, all but one of the several antennas 20, 20', namely antennas 20, are located along a circularly shaped arc 34 in the center of which the test location 16 or rather the device under test 12 is located. These antennas 20 are also located in a similar plane that is called main plane.

However, the respective arcs 32, 34 have different radii since the respective antennas 20 are located closer to the test location 16 or rather the device under test 12 than the reflectors 22, 22'. Put differently, the radial distance of the antennas 20 is shorter than the one of the corresponding reflectors 22, 22'.

The respective arcs 32, 34 each cover an angular area of 150°. However, an angular area up to 180° may be covered in general, which is sufficient for testing handover scenarios of the device under test 12, for instance.

The one antenna 20' that is not located on the circularly shaped arc 34 is also located in another plane, namely an auxiliary plane, which is offset to the main plane to which the other antennas 20 are assigned.

The respective planes, namely the main plane and the auxiliary plane, are parallel to each other, wherein the planes are also parallel to the drawing plane shown in FIG. 1.

In some embodiments, the respective antenna 20' is rotated about the center of the cylindrical quiet zone 30 by a polar angle that is different to the polar angle of the other antennas 20. However, this is not visible in the two-dimensional drawing shown in FIG. 1 due to the respective perspective, but it will be explained in more detail when referring to FIGS. 5 to 7.

Moreover, the reflector 22" corresponding to the respective antenna 20' is tilted with respect to a symmetry direction S compared to the other reflectors 22 as indicated by the arrow T in FIG. 1.

Merely all of the reflectors 22 are orientated in the same manner with regard to the symmetry direction S as shown in FIG. 1. The symmetry direction S is parallel to the axis of the cylindrically shaped quiet zone 30, for example the symmetry direction coincidences with the axis.

Accordingly, the one of the several reflectors 22, 22', namely the respective reflector 22', is tilted with regard to this axis or rather symmetry direction S in a different manner compared to the other reflectors 22. In some embodiments, the respective reflector 22' is the one that is associated with the respective antenna 20' located in the auxiliary plane and/or rotated about the center of the cylindrical quiet zone 30 by a polar angle that is different to the polar angle of the other antennas 20.

In general, the rotation about the center of the cylindrical quiet zone 30 by a different polar angle effects that the respective antenna 20' is located in a different plane, namely the auxiliary plane, than the other antennas 20 that are located in the main plane. To ensure that the respective antenna 20' still aims at the focal point of the corresponding reflector 22', the corresponding reflector 22' still located on the respective arc 34 has to be tilted appropriately.

Put differently, tilting the respective reflector 22' with respect to the symmetry direction S causes to reposition the corresponding antenna 20' or vice versa in order to ensure that the respective antenna 20' still aims at the focal point of the corresponding reflector 22' and that the antenna 20' and the corresponding reflector 22' shall contribute to the quiet zone 30 at the test location 16.

In FIG. 1, a respective schematic illustrating the spherical coordinates viewable in FIG. 1, namely azimuth angle $\varphi$ as well as radial distance r, is also provided. As already discussed, the polar angle $\theta$ defines the height out of the drawing plane.

Figure 4:
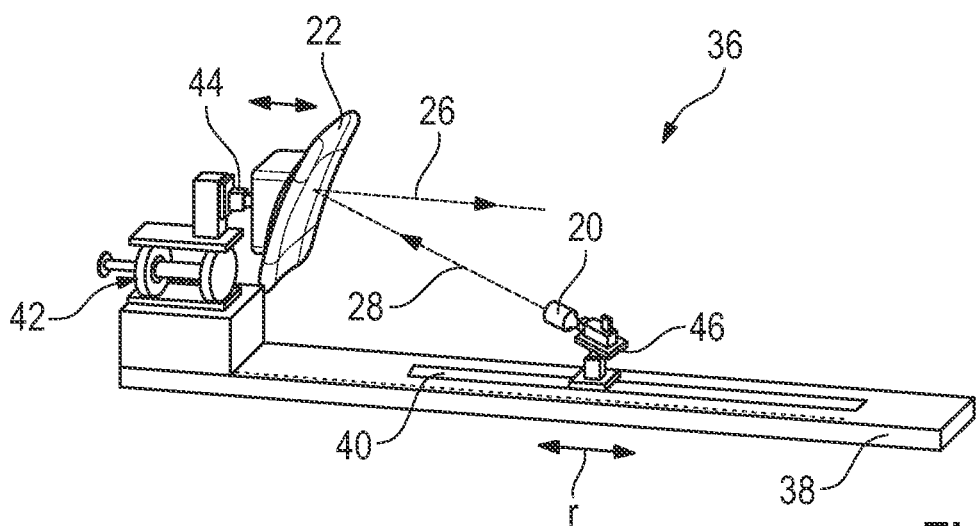
FIG. 4 schematically shows an adjustment unit of the measurement system according to a certain embodiment.

In the shown embodiment, the reflectors 22 and the corresponding antennas 20 are mechanically coupled with each other in a pairwise manner by an adjustment unit 36 that is shown in more detail in FIG. 4. The adjustment unit 36 comprises an adjustment member 38 on which the antenna 20 and the reflector 22 are located in a displaceable manner such that the radial distance r between the antenna 20 and the corresponding reflector 22 can be adjusted if necessary.

In some embodiments, the antenna 20 is placed within a slot 40 provided within the adjustment member 38 such that the antenna 20 can be moved along the adjustment member 38 along the length of the slot 40. Hence, the antenna 20 can be moved in a linear manner towards the reflector 22 or away from the reflector 22 as indicated by the arrows.

The reflector 22 is assigned to a linear adjustment member 42 via which the distance of the reflector 22 can be fine-tuned with respect to the antenna 20, for example via a screw mechanism. In some embodiments, the reflector 22 may also be moved in a linear manner towards the antenna 20 or away from the antenna 20 as indicated by the arrows.

Further, the adjustment unit 36 has a joint 44 with which the reflector 22 is mechanically coupled such that the orientation of the reflector 22 can be adjusted easily. Moreover, the antenna 20 is also mechanically coupled with the adjustment member 38 by a displaceable joint 46. Hence, each adjustment unit 36 is generally configured to adjust the relative orientation and/or position of the respective antenna 20 with respect to the corresponding reflector 22.

However, the relative orientation and/or position of the antenna 20 and/or reflector 22 with respect to the test location 16 can also be adjusted by the respective adjustment unit 36. Moreover, the adjustment units 36 are also configured to position the several reflectors 22 along a sphere or an ellipsoid enclosing the test location 16.

Generally, the reflector 22' that is tilted with respect to the other reflectors 22 may also be assigned to a joint 44 in order to adapt the respective orientation of the reflector 22' appropriately. In addition, a linear adjustment member 42 may also be provided for fine tuning the respective distance of the reflector 22'.

In the shown top views, the respective reflectors 22 are located on a table or rather a floor resulting in a horizontal arrangement of the entire measurement system 10.

However, the respective reflectors 22, 22' and/or antennas 20 may also be inclined with respect to the horizontal plane, for instance in a vertical manner (90° with respect to the horizontal plane) or any other angular inclination, for instance 60°, with respect to the horizontal plane. This will be described later in more detail when referring to FIGS. 5 to 7.

The respective arc 32 may be established by a support, for instance a rail or rather a bar, via which the reflectors 22, 22' are connected with each other. For inclining the reflectors 22, 22', the respective support is pivoted or rather set up from the horizontal plane, yielding the reflectors 22, 22' to be located at a certain angular inclination with respect to the horizontal plane.

In a similar manner, the respective arc 34 associated with the antennas 20 may be established by a support, for instance a rail or rather a bar.

Accordingly, an entire sphere or an entire ellipsoid can be covered by the different suitable positions of the reflectors 22, 22' and/or antennas 20.

As mentioned above, the respective antenna 20' is already orientated in a different plane compared to the other antennas 20 since the respective antenna 20' is rotated about the center of the cylindrical quiet zone 30 by a polar angle that is different to the polar angle of the other antennas 20.

In case of non-equally distributed reflectors 22, 22', at least one balance weight 47 is provided on the respective support, for example in case of an angled or rather vertical orientation of the respective reflectors 22, 22' due to the weight of the reflectors 22, 22'. Therefore, the respective balance weight 47 is illustrated by dashed lines in FIG. 1.

Furthermore, FIG. 1 reveals that the measurement system 10 comprises several absorbing baffles 48 that are located at different positions in order to provide a shielding and/or reduce coupling or rather scattering effects. Hence, interferences of the respective antennas 20, 20' is reduced.

As shown in FIG. 1, absorbing baffles 48 are located between neighbored reflectors 22, 22', namely between each pair of neighbored reflectors 22, 22', in order to reduce any coupling and/or scattering effects.

Furthermore, absorbing baffles 48 are located opposite of each reflector 22, 22' with respect to the test location 16, ensuring that electromagnetic signals propagating from the respective reflector 22, 22' towards the test location 16 are absorbed by means of the reflector 22, 22' after the electromagnetic signals have passed the test location 16. Put differently, the respective absorbing baffles 48 are located at a first end of a line at which opposite end the respective reflector 22, 22' is located, wherein the test location 16 is positioned on that line.

In addition, absorbing baffles 48 are located on the bottom between each antenna 20, 20' and the corresponding reflector 22, 22', for example on the adjustment unit 36, such that scattering and/or coupling effects are reduced.

Moreover, absorbing baffles 48 may also form partly opened housings 50 for the respective antennas 20, 20' that are located within the housing 50 made of absorbing baffle material. Hence, the respective antennas 20, 20' may focus on the corresponding reflectors 22, 22'. Put differently, the absorbing baffles 48 establish an aperture for the antennas 20, 20'.

Figure 2:
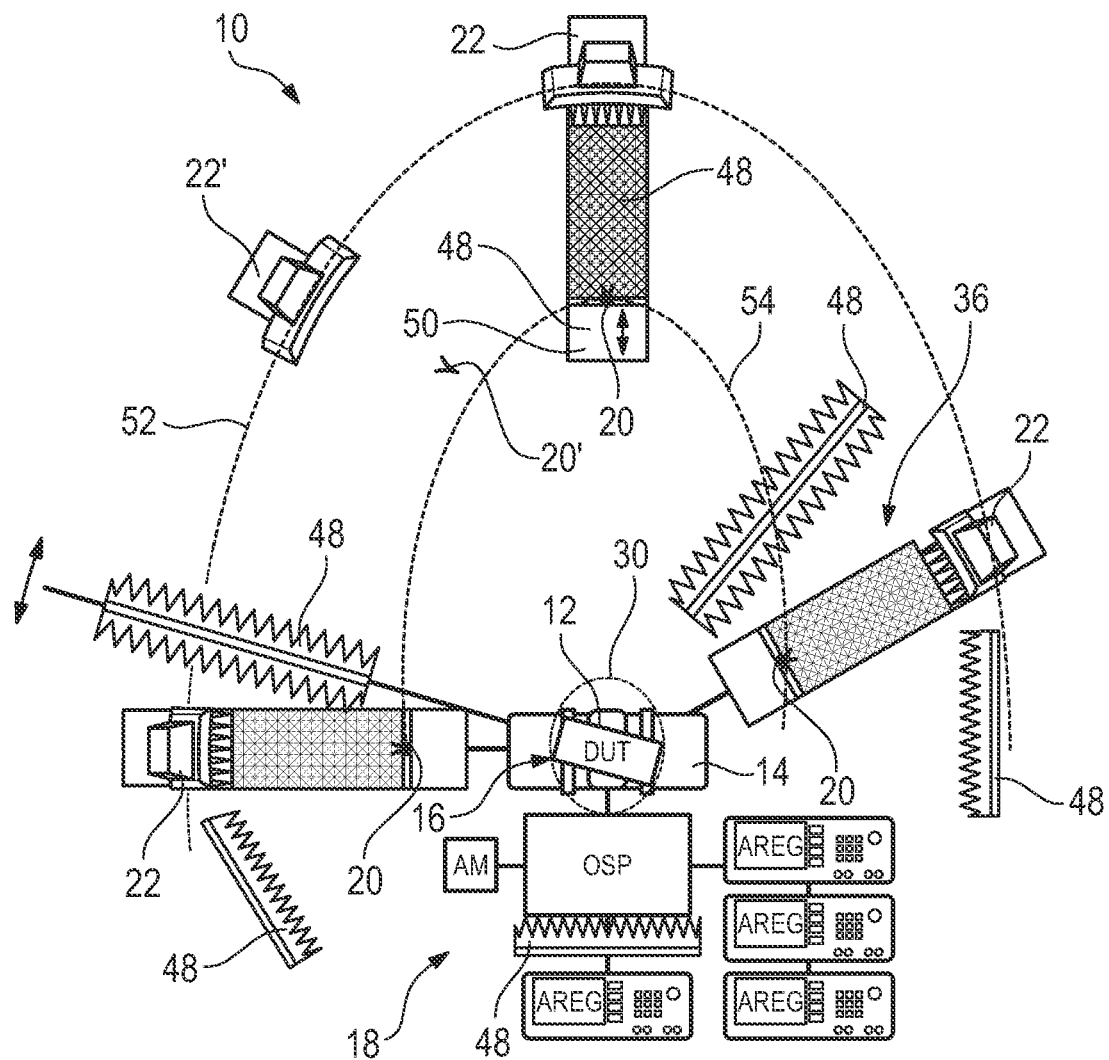
FIG. 2 shows a top view on a measurement system according to an embodiment of the present disclosure.

In FIG. 2, another embodiment of the measurement system 10 is shown that differs from the one shown in FIG. 1 in that the antennas 20 as well as the reflectors 22, 22' are located on elliptically shaped arcs 52, 54, respectively.

The respective antenna 20' is located offset with respect to the other antennas 20, namely due to a different polar angle.

In general, the measurement system 10 can be used performing different measurements simultaneously or rather subsequently.

Figure 3:
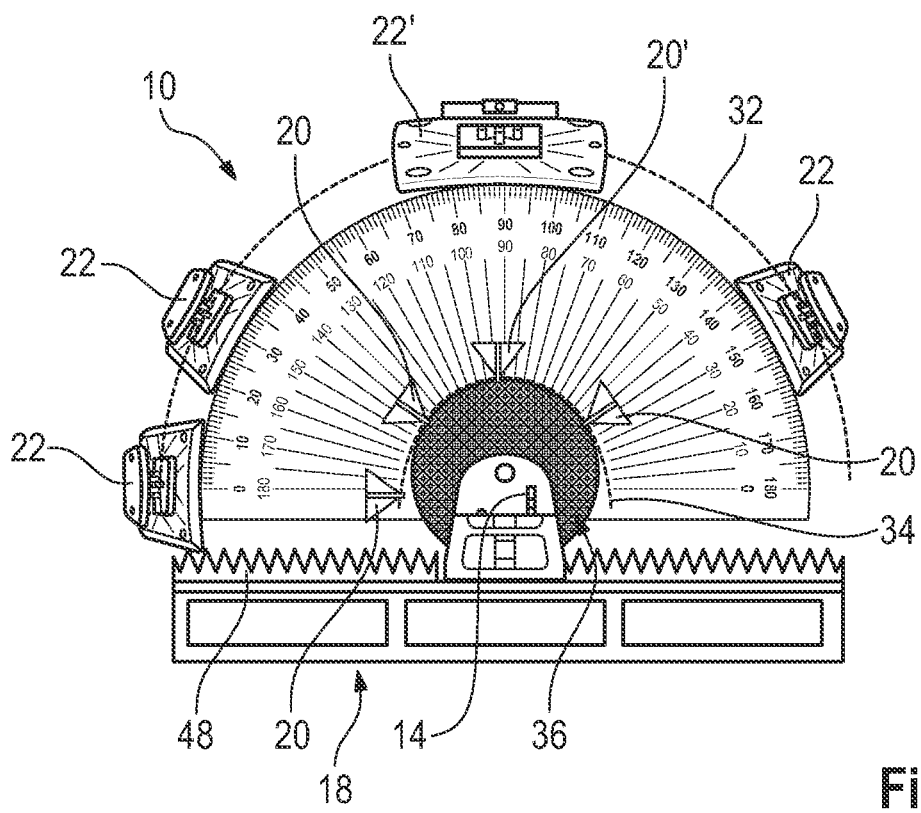
FIG. 3 shows a top view on a measurement system according to an embodiment of the present disclosure.

The embodiments shown in FIGS. 1 to 3 comprise one reflector 22, 22' that has a larger quiet zone 30, for instance of 30 cm, compared to the other reflectors 22, 22', which each may have a quiet zone 30 of only 20 cm.

In FIG. 3, the reflector 22' corresponding to the respective antenna 20' has the larger quiet zone 30. For instance, the focal length of the reflector 22, 22' with the larger quiet zone 30 is also different from the other reflectors 22, 22'. Hence, the reflectors 22, 22' have different characteristics.

Then, the corresponding antenna 20, 20' assigned to the reflector 22, 22' with the different focal length may be moved due to the different focal length of the respective reflector 22, 22' such that a different radial distance is provided compared to the other pairs.

Thus, the respective antenna 20 assigned to the reflector 22 with the different focal length is displaced with respect to the other antennas 20 that are located on the circularly or elliptically shaped arc 34, 54.

In other words, the several antennas 20 are no more located on the same arc 34, 54, as the antenna 20 associated with the reflector 22 with the different focal length is moved away from the respective arc 34, 54.

However, it is to be noted that these antennas 20 are still located in the same plane, namely the main plane.

In contrast thereto, the respective antenna 20' rotated about the center of the cylindrical quiet zone 30 by a polar angle different to the polar angle of the other antennas 20 associated with the main plane is still located in the auxiliary plane that is different to the main plane, but parallel thereto.

Furthermore, the distance between the reflectors 22, 22' and the test location 16 is maintained. Hence, all reflectors 22, 22' have the same distance to the test location 16. In other words, the reflectors 22, 22' are still located on the circularly or elliptically shaped arc 32, 52.

The potential linear movement of the respective antenna 20 is indicated in FIGS. 1 and 2 by the respective arrows. In some embodiments, the antenna 20 is moved along the adjustment unit 36 as discussed above.

In another embodiment, the focal length may be the same for all reflectors 22, 22'.

However, different sizes of the quiet zones 30 are obtained due to the different physical sizes of the reflectors 22, 22'. In some embodiments, one reflector 22, 22' is bigger than the other reflectors 22, 22', resulting in the larger quiet zone 30 for that specific reflector 22, 22'.

Generally, the respective reflector 22, 22' having the larger quiet zone 30 may be orientated vertically above or horizontally next to the device under test 12. In contrast thereto, the reflectors 22, 22' with the smaller quiet zone 30 are placed at different angular offsets from the large reflector 22, 22' with regard to the azimuth angle φ.

Moreover, the reflector 22, 22' having the larger quiet zone 30 can be used for radio frequency (RF) measurements, for instance in-band (IB) and out-of-band (OOB) measurements, whereas the reflectors 22, 22' with the smaller quiet zone 30 are used for radio resource management (RRM) and/or multiple-input multiple-output (MIMO) measurements.

Another embodiment provides that all reflectors 22, 22' have the same focal length as well as the same size of the respective quiet zones 30 provided at the test location 16. However, the reflectors 22, 22' may have different physical sizes.

In some embodiments, the corresponding antennas 20, 20' of the reflectors 22, 22' are operated at different frequencies.

This allows a wideband measurement, namely measuring several different frequency bands simultaneously, in the time of a single band measurement, as different frequency bands can be measured simultaneously.

In general, the different measurements mentioned above may be performed simultaneously or subsequently.

Figure 5:
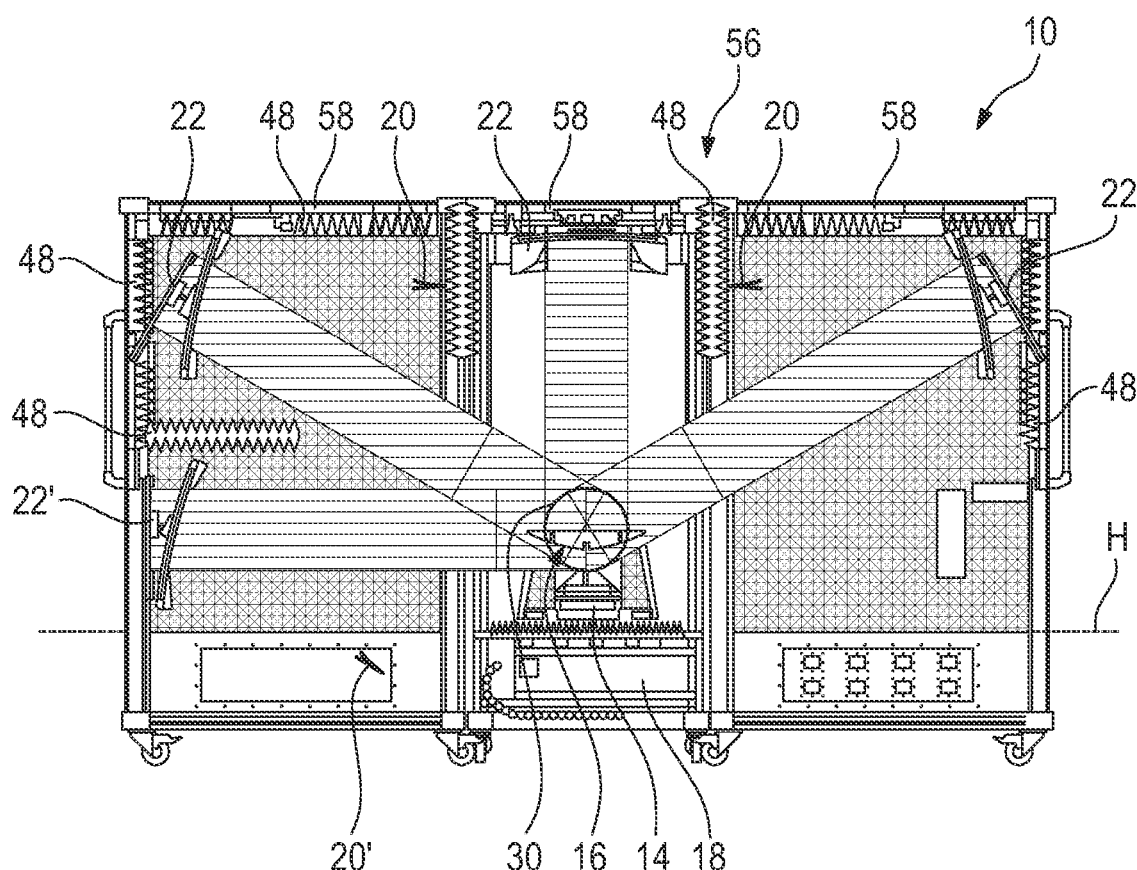
FIG. 5 shows a front view of a measurement system according to an embodiment of the present disclosure.
Figure 6:
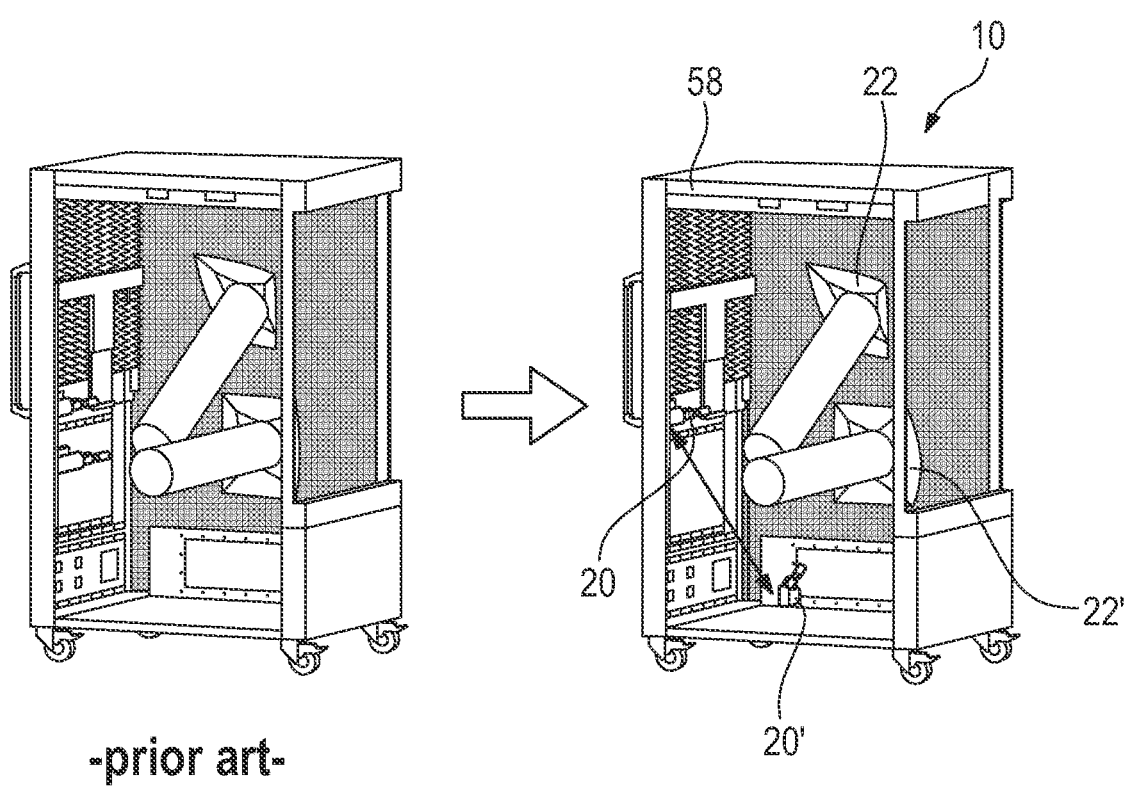
FIG. 6 shows an overview that shows a detail of the measurement system of FIG. 5.
Figure 7:
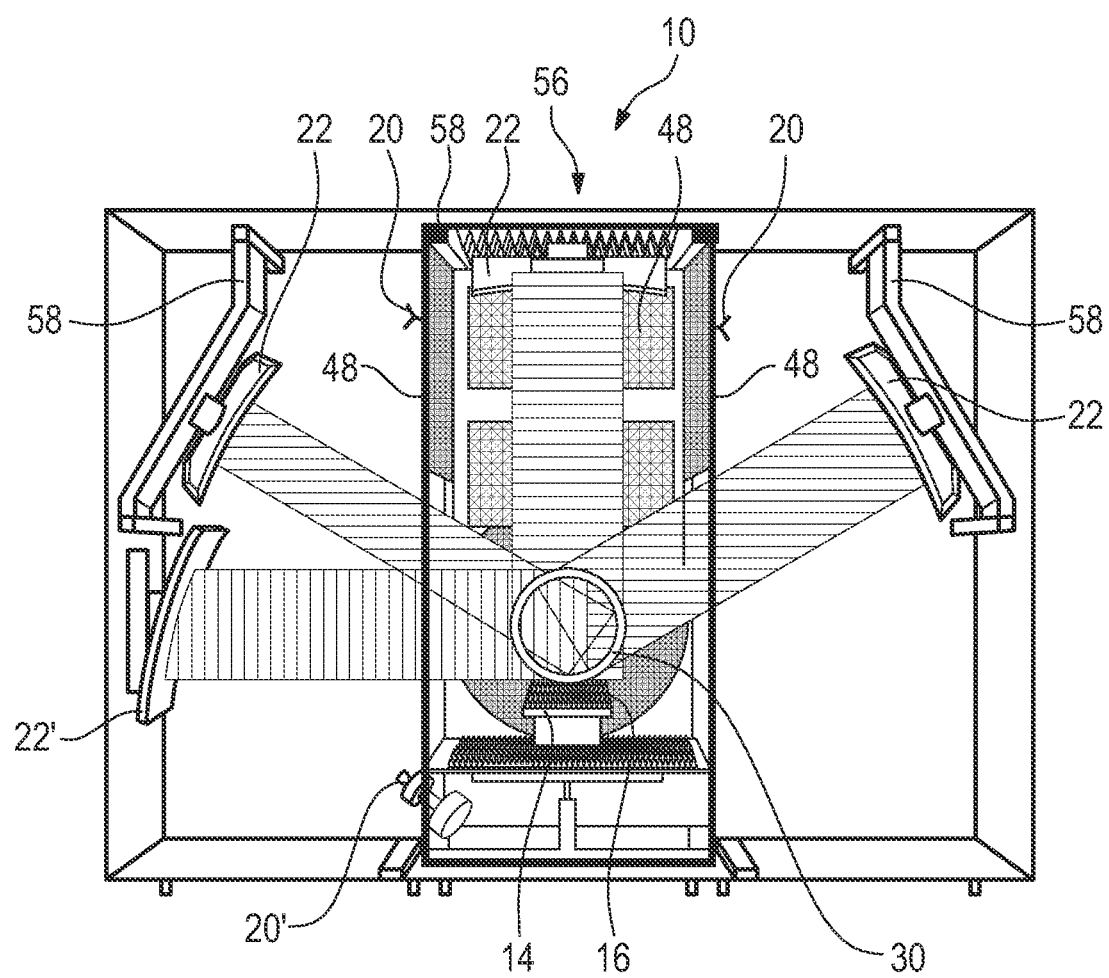
FIG. 7 shows the measurement system of FIG. 5 in a perspective view, wherein the baffles are arranged differently.

In FIGS. 5 to 7, the measurement system 10 is shown that is installed in a shielded housing 56 that is established by three parts 58 that movable trolleys. The separately formed trolleys 58 can be moved and combined with each other in order to establish the measurement system 10.

The respective antennas 20, 20' as well as the reflectors 22, 22' are located within the parts 58 or rather trolleys, wherein the middle part 58 comprises the positioner 14 and the test location 16.

In some embodiments, the measurement system 10 shown in FIGS. 5 to 7 corresponds to the one already described above since the respective reflectors 22, 22' and/or antennas 20 are inclined with respect to the horizontal plane H, namely in a vertical manner (90° with respect to the horizontal plane).

The reflectors 22, 22' are still arranged along the circularly or elliptically shaped arc 32 in the center of which the test location 16 or rather the device under test 12 is located.

In FIG. 6, an overview is shown that illustrates the offset position of the respective antenna 20' compared to the other antennas 20.

The left portion of FIG. 6 illustrates an arrangement of the respective antenna 20' in the main plane in which the other antennas 20 are also located, whereas the right portion of FIG. 6 illustrates that the respective antenna 20' is located by an offset such that it is located in another plane, namely the auxiliary plane.

This is achieved by moving or rather rotating the respective antenna 20' about the center of the cylindrical quiet zone 30 by a polar angle θ that is different to the polar angle of the other antennas 20.

Since the respective antenna 20' was rotated about the center of the cylindrical quiet zone 30, the corresponding reflector 22' also has to be turned in order to ensure that the respective antenna 22' still aims at the focal point of the corresponding reflector 22'. Accordingly, the respective reflector 22' is tilted appropriately.

In other terms, the pair consisting of the respective antenna 20' and the corresponding reflector 22', is rotated about the respective polar angle θ.

Accordingly, the respective antenna 20' is located in a different plane compared to the other antennas 20. Furthermore, the corresponding reflector 22' is orientated in a different manner compared to the other reflectors 22 as the respective reflector 22' is tilted.

In FIG. 7, the tilted reflector 22' is clearly visible compared to the other reflectors 22.

In general, the antennas 20 are located at different azimuth angles as shown in FIGS. 1 to 3, 5 and 7, whereas these antennas 20 are located in a common plane, namely the main plane. Hence, these antennas 20 are assigned to the same polar angle.

In addition, the respective antenna 20' is orientated at a polar angle different to the polar angle of the other antennas 20, resulting in that this respective antenna 20' is located in another plane compared to the main plane, namely the auxiliary plane.

In contrast thereto, the reflectors 22, 22' are located in a common plane, wherein they are located along the circularly or elliptically shaped arc in the center of which the test location 16 is located. However, the reflector 22' corresponding to the respective antenna 20' is tilted with respect to the other reflectors 22 in order to ensure that the respective antenna 20' that is positioned differently still aims at the focal point of the reflector 22'.

Thus, a coupling between adjacent antennas 20, 20' is reduced since the antennas 20, 20' are located in different planes, namely the main plane and the auxiliary plane that are offset with respect to each other. Since the coupling or rather interference among these antennas 20, 20' is reduced, the performance of the entire measurement system 10 is improved.

In other words, the separation between the antennas 20, 20' is increased when locating them in different planes.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement system for testing a device under test over-the-air, comprising a signal generation and/or analysis equipment, several antennas, several reflectors and a test location for the device under test,
   wherein the antennas are connected with the signal generation and/or analysis equipment in a signal-transmitting manner,
   wherein each of the antennas is configured to transmit and/or receive an electromagnetic signal so that a beam path is provided between the respective antenna and the test location,
   wherein the electromagnetic signal is reflected by the respective reflector so that the electromagnetic signal corresponds to a planar wave,
   wherein each antenna aims at a focal point of the corresponding reflector,
   wherein each antenna and the corresponding reflector together are configured to provide a corresponding quiet zone at the test location,
   wherein the antennas and the reflectors are placed at different angular offsets with respect to the test location, and
   wherein at least two of the several antennas are located within a main plane, whereas at least one of the several antennas is located in an auxiliary plane that is offset with respect to the main plane.

2. The measurement system according to claim 1, wherein the main plane and the auxiliary plane are parallel to each other.

3. The measurement system according to claim 1, wherein the quiet zone is a cylindrical quiet zone.

4. The measurement system according to claim 3, wherein, in spherical coordinates, the antenna located in the auxiliary plane is rotated about the center of the cylindrical quiet zone by a polar angle that is different to the one of the antennas located in the main plane.

5. The measurement system according to claim 1, wherein at least one of the reflectors is bigger than the at least one other reflector.

6. The measurement system according to claim 1, wherein the several reflectors are located along a circularly or elliptically shaped arc in the center of which the test location is located.

7. The measurement system according to claim 6, wherein the circularly or elliptically shaped arc maximally covers an angular area of 180°.

8. The measurement system according to claim 1, wherein at least the reflectors are each assigned to a corresponding adjustment unit configured to adjust the orientation of the respective reflector.

9. The measurement system according to claim 1, wherein the several reflectors are located at least partially along a sphere that encloses the test location at its center point.

10. The measurement system according to claim 9, wherein at least one balance weight is provided that is assigned to the reflectors in case of a non-equal distribution of the reflectors in an angled or rather vertical orientation of the respective reflectors along the sphere or an ellipsoid.

11. The measurement system according to claim 1, wherein at least one absorbing baffle is provided.

12. The measurement system according to claim 11, wherein the at least one absorbing baffle is located between neighbored reflectors.

13. The measurement system according to claim 11, wherein the at least one absorbing baffle is located between at least one reflector and the test location.

14. The measurement system according to claim 11, wherein the at least one absorbing baffle provides a partly opened housing for at least one antenna.

15. The measurement system according to claim 11, wherein the at least one absorbing baffle is located at a first end of a line at which opposite end the reflector is located.

16. The measurement system according to claim 1, wherein the measurement system comprises a positioner to which the test location is assigned.

17. The measurement system according to claim 16, wherein the positioner is at least one of a rotary positioner and a three-dimensional positioner.

18. A measurement system for testing a device under test over-the-air, comprising a signal generation and/or analysis equipment, several antennas, several reflectors and a test location for the device under test, wherein the antennas are connected with the signal generation and/or analysis equipment in a signal-transmitting manner, wherein each of the antennas is configured to transmit and/or receive an electromagnetic signal so that a beam path is provided between the respective antenna and the test location, wherein the electromagnetic signal is reflected by the respective reflector so that the electromagnetic signal corresponds to a planar wave, wherein each antenna aims at a focal point of the corresponding reflector, wherein each antenna and the corresponding reflector together are configured to provide a corresponding cylindrical quiet zone at the test location, wherein the antennas and the reflectors are placed at different angular offsets with respect to the test location, and wherein, in spherical coordinates, one of the several antennas is rotated about the center of the cylindrical quiet zone by a polar angle that is different to the polar angle of at least one other antenna.

19. A measurement system for testing a device under test over-the-air, comprising a signal generation and/or analysis equipment, several antennas, several reflectors and a test location for the device under test, wherein the antennas are connected with the signal generation and/or analysis equipment in a signal-transmitting manner, wherein each of the antennas is configured to transmit and/or receive an electromagnetic signal so that a beam path is provided between the respective antenna and the test location, wherein the electromagnetic signal is reflected by the respective reflector so that the electromagnetic signal corresponds to a planar wave, wherein each antenna aims at a focal point of the corresponding reflector, wherein each antenna and the corresponding reflector together are configured to provide a corresponding quiet zone at the test location, wherein the antennas and the reflectors are placed at different angular offsets with respect to the test location, and wherein at least two of the several reflectors are orientated with respect to a symmetry direction in a similar manner, whereas at least one of the several reflectors is tilted with respect to the symmetry direction compared to the other reflectors.

\* \* \* \* \*